United States Patent [19]

Meinzer

[11] Patent Number: 5,506,857
[45] Date of Patent: Apr. 9, 1996

[54] SEMICONDUCTOR LASER PUMPED MOLECULAR GAS LASERS

[75] Inventor: Richard A. Meinzer, Glastonbury, Conn.

[73] Assignee: United Technologies Corporation, Hartford, Conn.

[21] Appl. No.: 980,016

[22] Filed: Nov. 23, 1992

[51] Int. Cl.$^6$ ............................... H01S 3/22; H01S 3/223
[52] U.S. Cl. ............................................. 372/55; 372/101
[58] Field of Search ................................ 372/55, 71, 101

[56] References Cited

U.S. PATENT DOCUMENTS

| | | | |
|---|---|---|---|
| 3,982,201 | 9/1976 | Rosenkrantz et al. | 331/94.5 P |
| 4,126,832 | 11/1978 | Schlossberg et al. | 372/55 |
| 4,177,435 | 12/1979 | Brown | 372/55 |
| 4,276,517 | 6/1981 | McAllister | 372/71 |
| 4,318,060 | 3/1982 | Davis | 372/55 |
| 4,710,940 | 12/1987 | Sipes, Jr. | 372/75 |
| 4,942,586 | 7/1990 | Lai | 372/101 |
| 5,058,980 | 10/1991 | Howerton | 358/31 |
| 5,202,893 | 4/1993 | Kubota et al. | 372/101 |

FOREIGN PATENT DOCUMENTS 2004413  3/1979  United Kingdom .

OTHER PUBLICATIONS

Proposal for the Development of a Diode Pumped Sealed Gas Laser Tube (P91–259); Richard A. Meinzer, Jul. 8, 1991.

IEEE Transactions on Instrumentation and Measurement, entitled "Experimental Study of the Laser Diode Pumped Rubidium Maser", by A. Michaud et al., vol. 40, No. 2, Apr. 1991, New York, US, pp. 170–173.

Primary Examiner—Rodney B. Bovernick
Assistant Examiner—Robert E. Wise
Attorney, Agent, or Firm—Gerald L. DePardo

[57] ABSTRACT

A gas laser cavity 44 comprising a molecular gas 52, such as a Hydrogen Halide, is pumped by a plurality of semiconductor lasers 20 which provide light carried along optical fibers 26 that provide divergent light 32 to a collimating lens 34 that provides collimated light 36 to a focussing lens 38 that provides pumping light 40 which propagates within the gas laser cavity 44 in a zig-zag pattern, thereby providing a homogeneously excited medium and providing sufficient pathlength to give adequate absorption of the pump light. The pump light 40 has a wavelength within the absorption frequency band of the gas 52 and a wavelength capable of pumping the gas molecules from the ground state to an excited state. Alternatively, the absorption frequency band of the gas 52 may be broadened by adding an inert gas, such as Argon, at a higher pressure than the Hydrogen Halide gas. Also, the output wavelength of the laser diodes 20 may be tuned to the center of the absorption frequency band of the gas 52 by adjusting the temperature of the diodes with thermoelectric coolers 28.

26 Claims, 9 Drawing Sheets

SEMICONDUCTOR LASER PUMPED MOLECULAR GAS LASERS

CROSS REFERENCES TO RELATED APPLICATIONS

Copending U.S. patent application Ser. No. 980,020, filed contemporaneously herewith, contains subject matter related to that disclosed herein.

TECHNICAL FIELD

This invention relates to gas lasers, and more particularly, to pumping of gas lasers with a semiconductor laser.

BACKGROUND ART

It is known that "pumping" is a process by which the energy of molecules in a gas medium is raised to a vibrational and rotational energy level to allow lasing to occur. The total number of excited molecules per $cm^3$ above a known threshold for a given medium creates a "population inversion" which allows the excited molecules to lase, i.e., emit photons, when excited molecules transition from one excited (pumped) energy level to a lower level.

It is also known that there are numerous ways to pump molecular gas lasers. For example, a Carbon Dioxide ($CO_2$) gas laser may be pumped electrically by injecting electrons into the $CO_2$ by a plasma and the collisions between the electrons and molecules excite the gas molecules. This technique allows the same $CO_2$ molecules to be re-used each time the laser is pumped. Helium-Neon (HeNe) lasers are also pumped in this fashion. However, electrically pumped $CO_2$-lasers typically have a low efficiency, e.g., 5–10%, defined as output optical power at the desired wavelength divided by total electric input power. Also, for high power $CO_2$ lasers, the gas is typically pumped through the cavity in a "closed cycle" to dissipate heat. This is also called a "flowing" laser system.

Some gas lasers, such as Hydrogen Fluoride (HF) and Deuterium Fluoride (DF), may not be pumped electrically because direct collisions with electrons will not excite the gas molecules to allow lasing to occur. Instead, pumping is performed chemically by reacting two or more atoms/molecules together. For example, for an HF laser, Fluorine (F) atoms are reacted with $H_2$ to create a vibrationally excited HF. With cw pumping, the reactants are consumed in the reaction, thereby requiring a fresh supply of reactants to re-excite (or re-pump) the system. Thus, an HF laser is a "consumable" or "open cycle" laser system that does not allow reuse of the same molecules. Also, consumable lasers are expensive to run because chemicals must be continuously provided and pumped away. Further, both consumable and flowing systems take up more physical space because they require pump hardware along with nozzles, valves, and other plumbing hardware.

It is also known that gas lasers, such as HF, can sustain high laser output power when they are chemically pumped, and have a highly coherent output beam.

Alternatively, as is known, a gas laser may be thermally pumped by heating the gas to a predetermined temperature, e.g., a gas dynamic $CO_2$ laser. However, this process also has a low efficiency and requires external heating hardware or a chemical reaction to generate the required gas temperature.

Furthermore, when a gas laser is pumped by heat or electrons, etc., all energy levels are pumped. Consequently, all the excitable levels within the medium are pumped and lasing can occur from all potential lasing levels. The energy contained within the nonlasing levels is released as waste heat which must be removed by rapid flowing of the gas. For HF or DF gases, to permit amplification of a single or small number of output lasing wavelengths (i.e., a narrow wavelength spread), a laser cavity must be designed to reflect (and partially transmit) the desired output lasing wavelengths, and reflect the undesired lasing wavelengths with sufficient reflection loss to prevent light amplification from occurring, e.g., by using a grating for wavelength discrimination. This type of pumping causes inefficiencies because the total energy required to pump the gas to the excited state (i.e., the sum of all the individual pumping energies needed to provide each lasing wavelength) is much greater than the desired optical energy output (i.e., a single or small number of output wavelengths). Thus, the energy expended to pump (excite) the unused lasing transitions is lost.

Therefore, it would be desirable to obtain a gas laser that does not consume gas for lasing, does not require fast flowing of gas for cooling, and does not have the lasing inefficiencies of currently available pumped gas lasers, yet provides the highly coherent output beam quality of gas lasers.

DISCLOSURE OF INVENTION

Objects of the invention include provision of a semiconductor laser pumped gas laser which does not require consumption of gas to create an excited medium for lasing action.

According to the present invention, a plurality of semiconductor lasers, such as laser diodes, provide output light which is incident upon and excites a molecular gas lasing medium, thereby causing lasing thereof; the laser light having a wavelength spread within the absorption band of the gas and having a wavelength/energy that is compatible with gas energy levels.

According further to the invention, the semiconductor lasers are temperature controlled to tune the semiconductor laser output wavelength to near the center of absorption band of the gas laser.

Still further according to the invention, the gas lasing medium comprises a hydrogen halide, such as Hydrogen Fluoride (HF). According further to the invention, the gas lasing medium further comprises an inert gas, such as Argon (Ar), to pressure broaden the absorption frequency band.

According still further to the invention, optical fibers are used to propagate the diode laser light from the laser diodes to the gas laser. In still further accord to the invention, the optical fibers are located along the inside of the gas laser cavity and pump the gas by the evanescent field emanating from the sides of the fibers, which are selected to optimize the emission of this field, e.g., by having similar reflective indices for the cladding and the core of the fibers.

The present invention represents a significant improvement over the prior art by providing a non-consumable gas laser having a highly coherent output and being pumped by an efficient semiconductor laser. Also, the invention provides the ability for a gas laser to lase at a small number of wavelengths, thereby allowing tailoring of the lasing process and avoiding the typical losses associated with pumping gas lasers. Further, the invention may be used in any application that requires a highly coherent beam, e.g., laser welding, laser surgery, etc. Also, the invention is more compact and has a faster turn-on time than consumable or pumped gas lasers. Still further, the invention provides a scalable gas laser that may easily be scaled to higher powers by merely adding more laser diodes.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Figure 1:
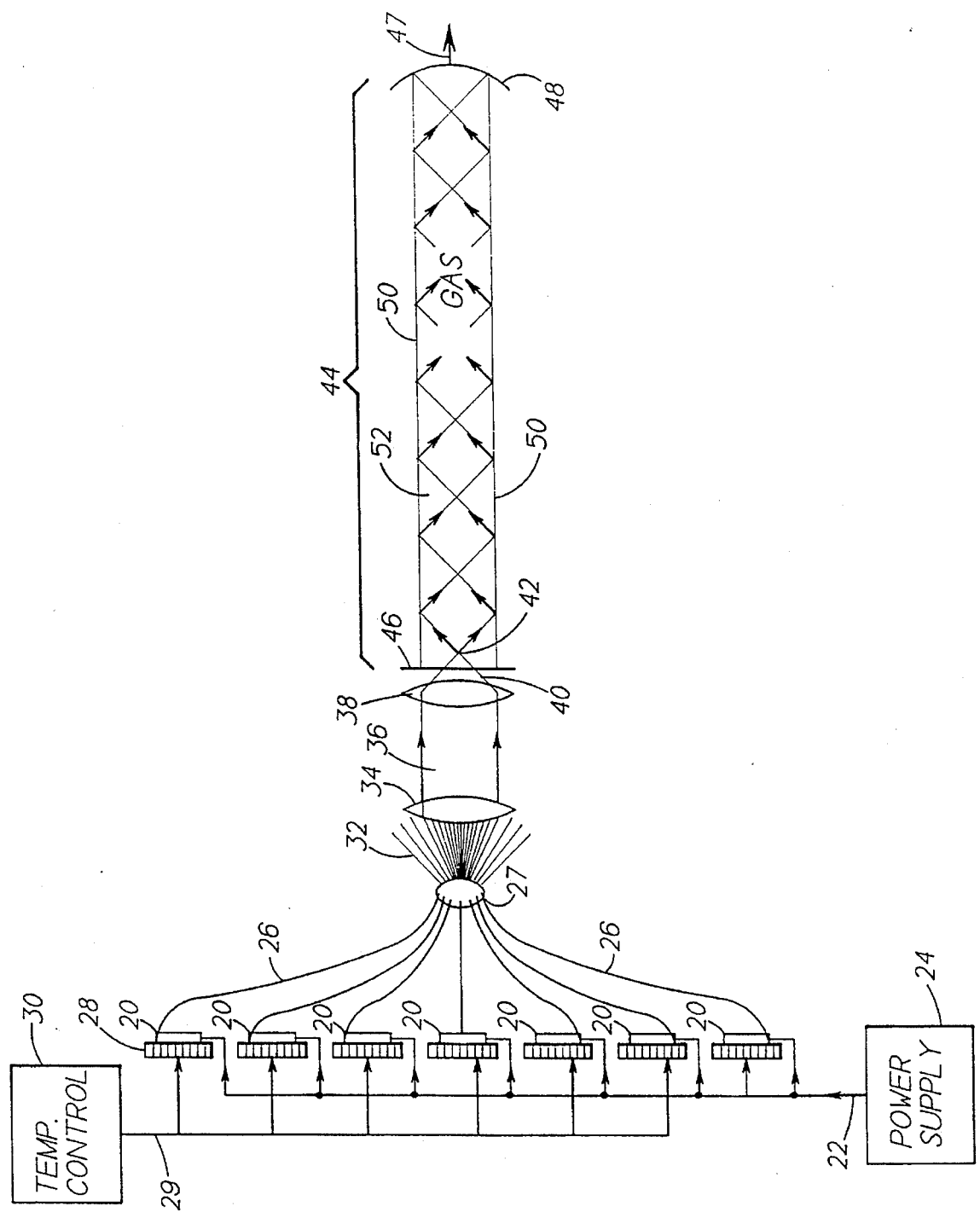
FIG. 1 is a diagram showing a plurality of laser diodes coupled to optical fibers which emit light through optical elements to pump a laser cavity filled with gas, in accordance with the present invention.

Referring now to FIG. 1, a plurality of laser diodes 20, e.g., Spectra Diode Labs SDL-5400, are driven by current signals on lines 22 from a power supply 24 capable of controlling the current to each of the diodes 20, individually. For continuous wave (cw) operation, the current on the line 22 is a direct current or dc and for pulsed laser operation, the current is pulsed at the desired optical pulse rate. Each laser diode 20 is connected to one of a plurality of optical fibers 26, at one end of the fiber. The other end of each fiber 26, is bundled together in a bundle 27. The optical fibers 26 act as a conduit for carrying the light emitted from the laser diodes 20. Also, each laser diode 20 is disposed on a thermoelectric (TE) cooler 28 to adjust the temperature thereof and, thereby adjust the center frequency of the output light therefrom. Each of the TE coolers 28 is driven by signals on lines 29 from a temperature control circuit 30 capable of controlling each of the TE coolers 28, individually. Other laser diodes may be used if desired provided the output wavelength/energy characteristics meet the requirements discussed herein.

The laser diodes 20, as is known, produce highly diffractive or divergent light. This light is injected into optical fibers 30 by standard techniques, e.g., a microlens, or butting the fiber to the laser diode. The output of the optical fibers 30 is a collection of light 32 from the plurality of laser diodes 20.

The divergent light 32 is passed through a collimating lens 34 which provides an output collimated light 36. The collimated light 36 is passed through a focusing lens 38 which provides a focused beam 40 having a focal point 42 inside a laser cavity 44.

The laser cavity 44 comprises a first mirror 46 being anti-reflective at the wavelength of the laser diode, e.g., 0.9 microns, thereby allowing all the light 40 to enter the cavity 44, and being totally reflective at the wavelength of a desired output beam 47 from the laser, e.g., 1.5 microns. A second mirror 48 is located on the opposite end of the cavity 44 and is about 95% reflective (or 5% transmissive) at the output laser beam 47 wavelength, e.g., 1.5 microns, and totally reflective at the laser diode pumping wavelength, e.g., 0.9 microns. The side walls of the laser cavity 44 comprise a glass tube 50 having a coating which is highly reflective at all wavelengths, such as gold or a dielectric coating, such that the input pumping wavelength cannot escape from the cavity 44. Thus, the tube 50 behaves like a waveguide. The length of the cavity is approximately twenty centimeters and the diameter of the cavity is about two millimeters. Other lengths and diameters may be used if desired. It should be understood that FIG. 1 is not drawn to scale for illustrative purposes.

The focused light 40 propagates within the laser cavity 44 in a zig-zag pattern, thereby making the total path length of the pumping light much longer than the actual length of the cavity 44 (discussed hereinafter). Also, the zig-zag pattern is used to inject the pumping energy relatively uniformly to provide a substantially homogeneous excited medium.

Inside the cavity 44 is a molecular gas gain medium, such as Hydrogen Fluoride (HF); however, any molecular gas may be used provided it matches with the characteristics of the laser diode (discussed hereinafter). For example, any Hydrogen Halide gas may be used, such as Hydrogen Chloride (HCl), Hydrogen Bromine (HBr), DF, HF. Also, the gas may be combined with an inert gas, such as Ar, to broaden the absorption frequency band, also discussed hereinafter.

Figure 2:
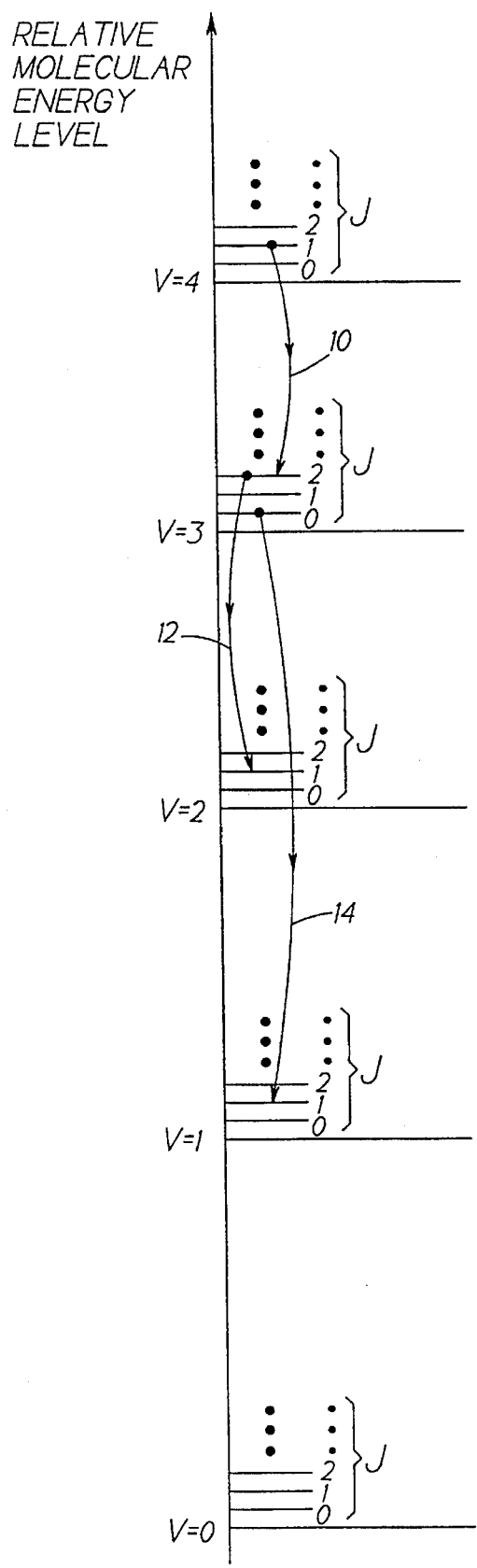
FIG. 2 is a diagram of the relative molecular energy levels in a molecular gas medium and types of lasing transitions, in accordance with the present invention.

Referring now to FIG. 2, in order to produce an "excited" gain medium needed for lasing to occur in a molecular gain medium, the molecules within the gain medium must be excited (or pumped) to a known vibrational and rotational energy level. The vibrational energy level is typically indicated by a V quantum number, and the rotational energy level is typically indicated by a J quantum number. Each vibrational or V energy level has a plurality of closely spaced rotational or J energy sub-levels associated therewith. In general, as the number increases, the level of energy (or the level of excitement) of the molecules increases.

As is known, once a molecule is excited to a given energy level (or excited state), and it transitions to lower energy level, a photon (or light packet) is emitted having a wavelength related to the energy difference between the two levels. More specifically, when a molecule undergoes an optical transition between a higher V-level and lower V-level, a photon is emitted having a known optical frequency (v) defined by the equation: $v = \Delta E/h$, where $\Delta E$ is the energy difference between the two levels concerned, and h is Plancks constant. The wavelength $\lambda$ of the emitted light is related to the optical frequency v of the light emitted by the equation: $\lambda = c/nv$, where c is the speed of light and n is the index of refraction of the medium.

As is known, an emission process may occur in two distinct ways. Spontaneous emission, in which the molecule drops to a lower level in an entirely random way, and stimulated emission in which the molecule is "triggered" to undergo the transition by the presence of photons of a wavelength equal to that of the transition. The stimulated emission process, as is known, results in coherent radiation because the waves associated with the stimulating and stimulated photons have the same frequencies, are in phase, and have the same polarization. Thus, with stimulated emission, the amplitude of an incident wave can grow as it passes through a collection of atoms producing the commonly known laser action. To produce laser action, as is known, the total number of excited molecules per cubic-centimeter (cc) must be greater than a known predetermined level for a given material, creating what is known as "population inversion".

There are typically two types of lasing transitions which can occur with molecular gas lasing mediums, P-branch vibrational-rotational transitions and R-branch vibrational-rotational transitions. For a P-branch transition, the J-level increases, while for an R-branch transition, the J-level decreases. In both cases the V-level decreases by at least one level.

When the V-level changes by only one number, the transition is called a "fundamental" lasing transition. For example, in FIG. 1, a P-branch fundamental transition from v=4, J=1 to v=3, J=2 is indicated by a line 10. Also, if a molecule with an energy level v=3, J=2 transitions to a level of v=2, J=1, as indicated by a line 12, this is an R-branch fundamental lasing transition.

If the V-level changes by 2 or more, the transition is called a "overtone" transition. Thus, in FIG. 1, a transition from v=3, J=0 to v=1, J=1 is a P-branch overtone transition, as indicated by a line 14. As is known, the wavelengths of the photons emitted for each of the aforementioned transitions 10,12,14 are different from each other, and are determined by the given gain medium.

Figure 3:
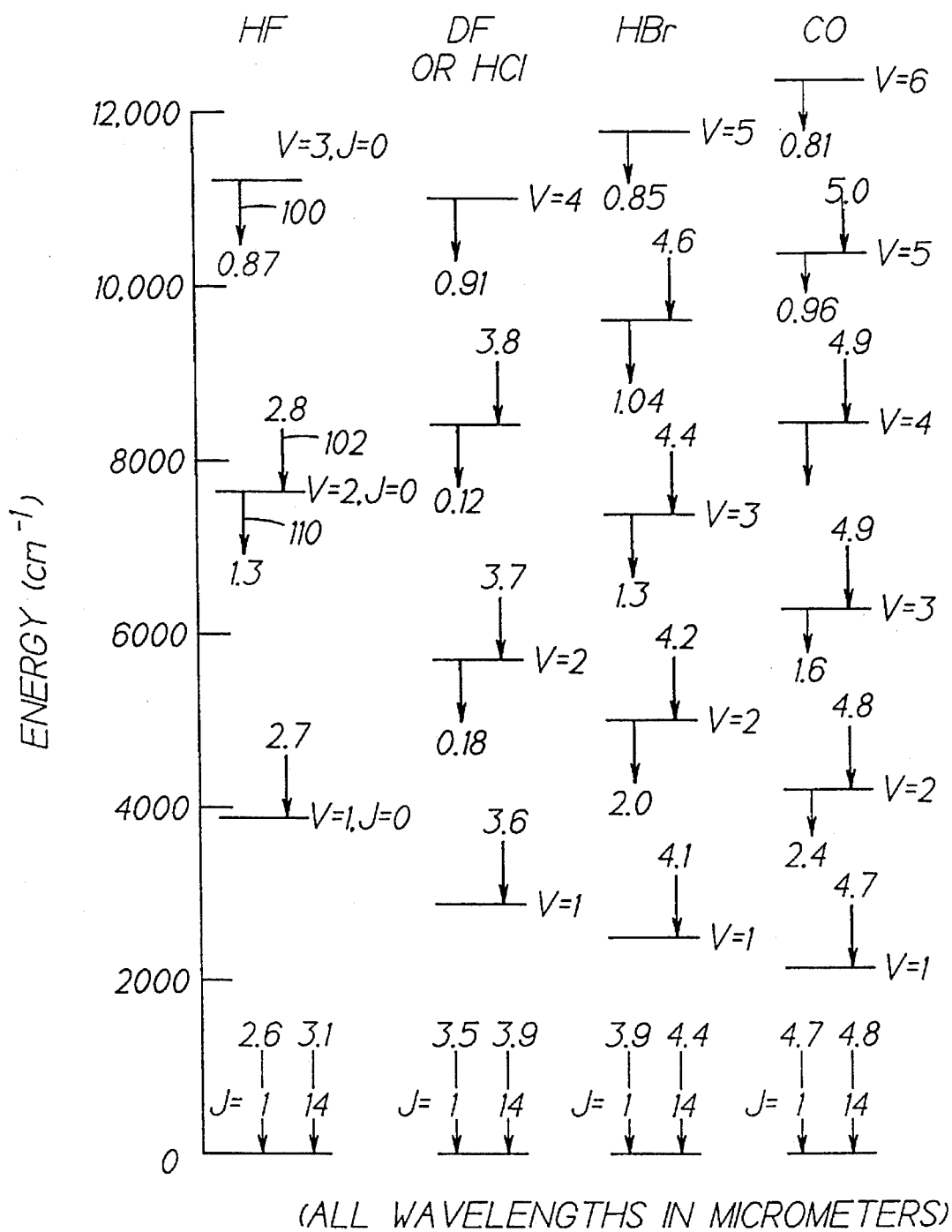
FIG. 3 is a diagram showing the molecular energy levels and lasing transitions for specific gases, in accordance with the present invention.

Referring now to FIG. 3, for efficient diode optical pumping, a gas having energy levels near that of the laser diode is needed. Some possible gas media are illustrated in FIG. 3 which shows the molecular energy level spacings in the corresponding lasing wavelengths and pump wavelengths.

For example, for HF gas, the HF molecules may be pumped to the v=3, J=0 level with a diode pumping wavelength of approximately 0.87 microns which is a typical value for currently available laser diodes. Similarly, a wavelength of approximately 0.91 microns will excite DF or HCl molecules into the v=4 state. Also, a wavelength of 0.85 microns will excite HBr molecules into the v=5 state, and a wavelength of 0.81 microns will excite CO molecules into the v=6 state. The arrows leaving from a given energy level, such as on line 100, indicate the wavelength emitted when transitioning from that level down to v=0 or ground level. Similarly, arrows entering a given energy level, such as on line 102, indicates the lasing wavelength emitted when transitioning from one V-level above, e.g., a transition in HF from v=3 down to the v=2 level emits a photon having a wavelength of about 2.8 microns, as indicated by the line 102.

Figure 4A:
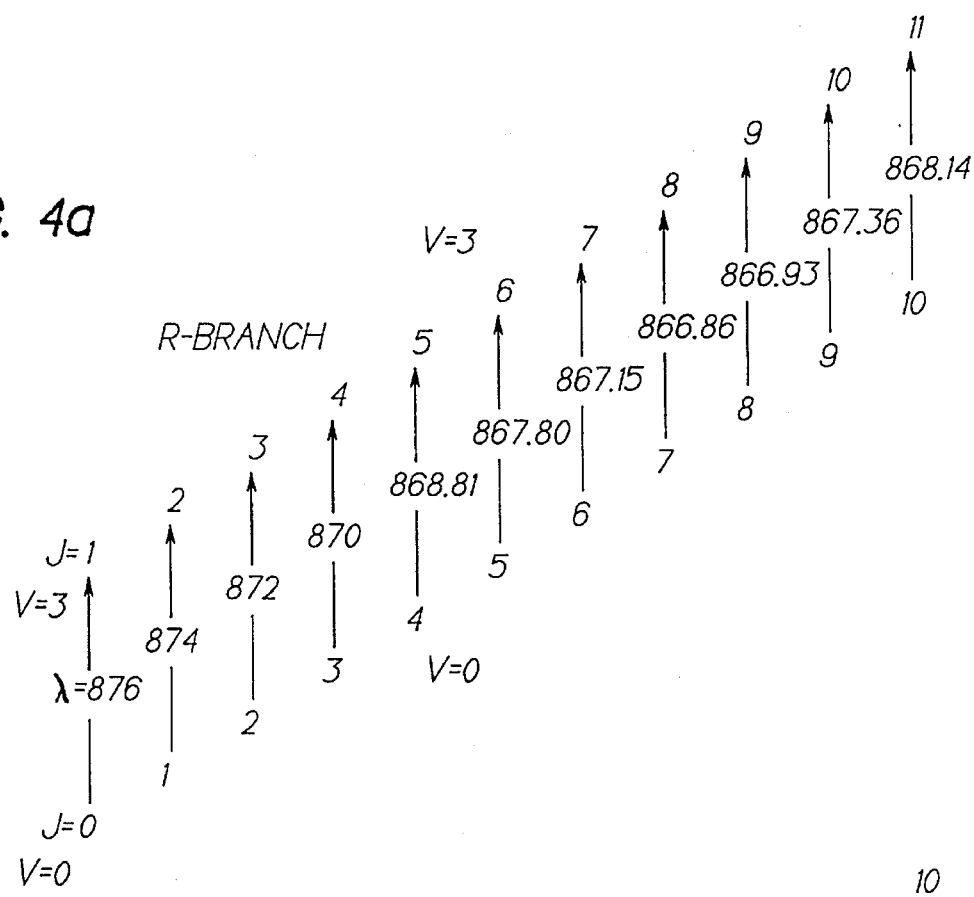
FIG. 4a is a diagram showing R-branch HF pumping transitions for laser diode pumping of HF gas from the v=0 to v=3 level, in accordance with the present invention.
Figure 4B:
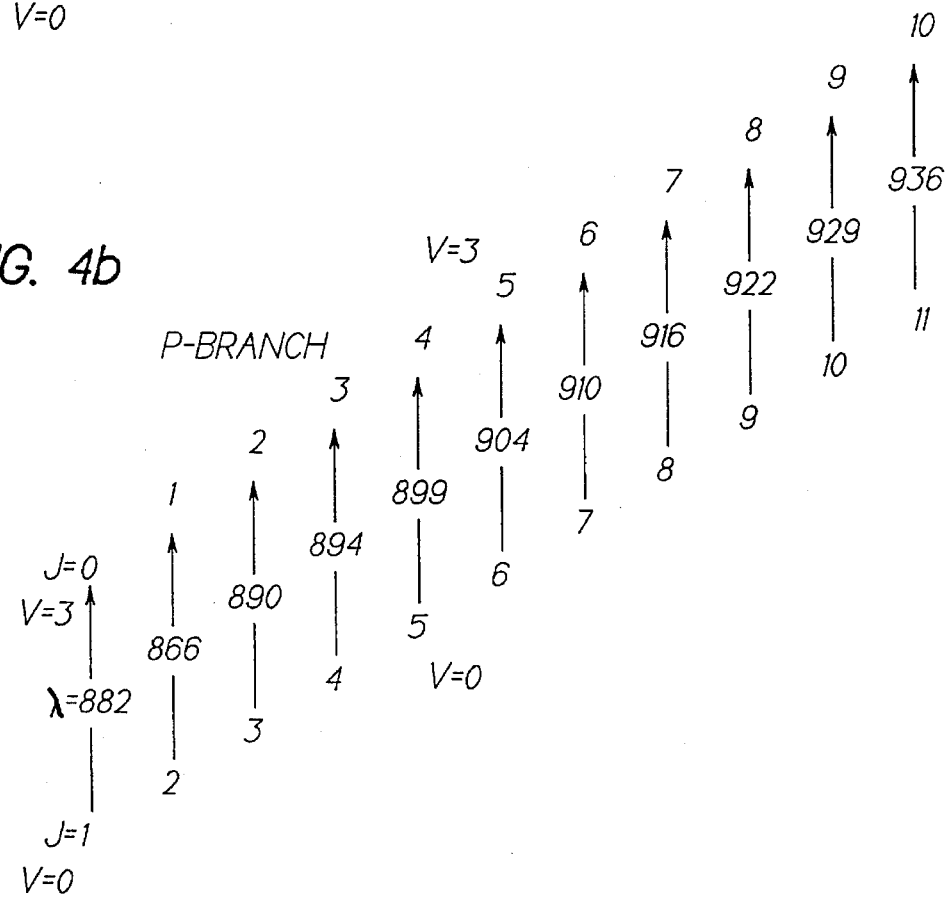
FIG. 4b is a diagram showing HF P-branch pumping transitions for laser diode pumping of HF gas from v=0 level to v=3 level, in accordance with the present invention.

Referring now to FIGS. 4a and 4b, the HF transitions for laser diode pumping from a state v=0 to v=3 for R-branch and P-branch pumping transitions, respectively. For example, for pumping an R-branch transition (FIG. 4a) from v=0, J=3 to v=3, J=4 requires a wavelength of 870 nm or 0.87 microns. Similarly, for a P-branch pumping transition (FIG. 4b) from the state v=0, J=4 to v=3, J=3, a laser diode pumping wavelength of 894 nm or 0.894 microns is required for an HF medium. It should be understood that the type of pumping transition, i.e., P-branch or R-branch, is not related to the type of downward lasing transition, i.e., P-branch or R-branch, that occurs. However, it is important to note what wavelength is needed to pump to a certain desired energy level.

Figure 5:
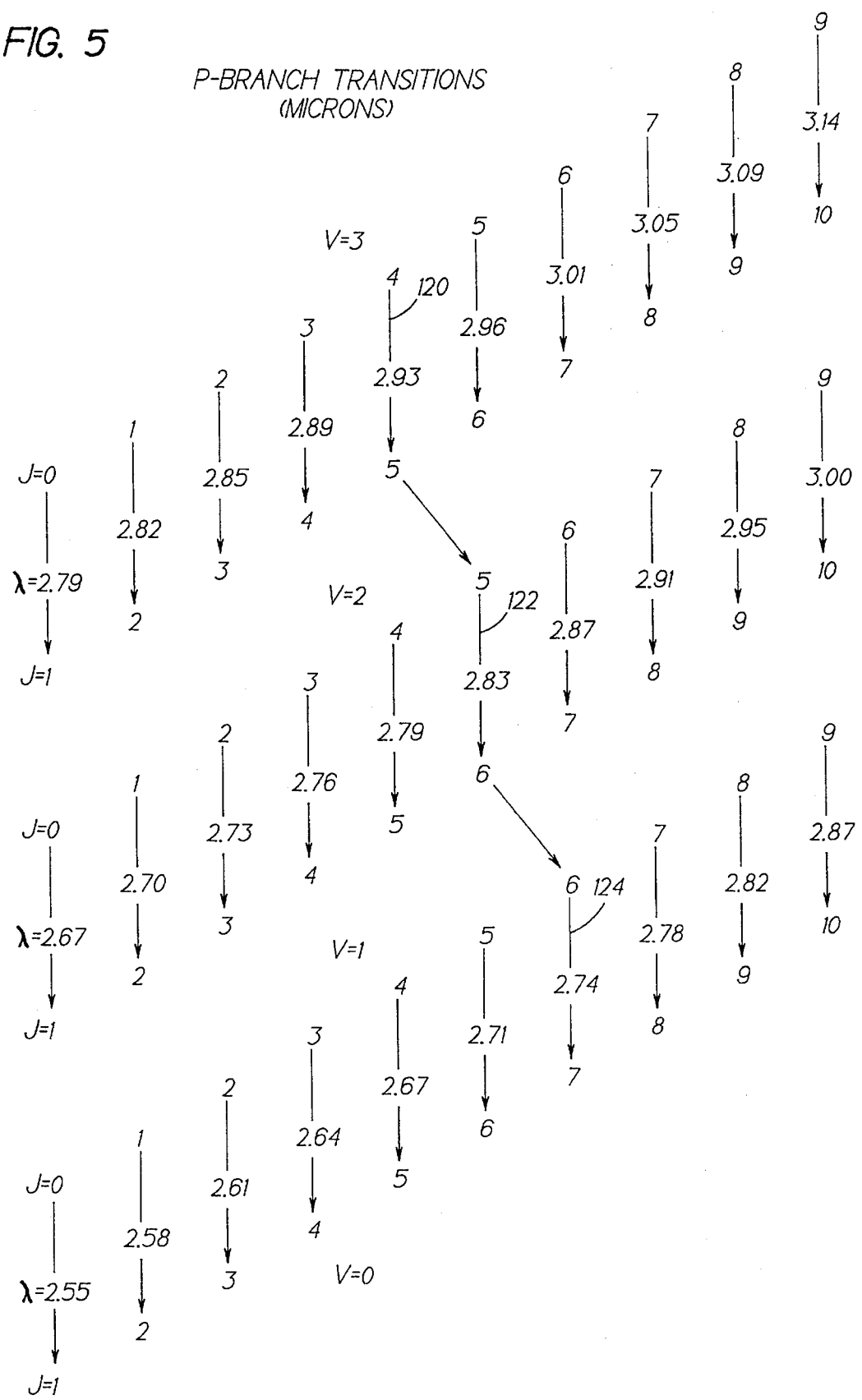
FIG. 5 is a diagram showing HF P-branch fundamental lasing transitions from v=3 to v=2, from v=2 to v=1, and from v=1 to v=0 level, and the associated wavelengths emitted, in accordance with the present invention.

Referring now to FIG. 5, after the medium is pumped to an excited energy level, the molecule can optically transition downward from that level to the ground state. When the molecule optically transitions from the v=3 to the v=2 level, from the v=2 to the v=1 level or from v=1 to v=0 level, i.e., a fundamental optical lasing transition, the emitted output lasing wavelength is as indicated. For example, if the medium is pumped to the v=3, J=4 state, and the P-branch transition occurs to the v=2, J=5 state, a photon having a wavelength of 2.93 microns is emitted as indicated by a line 120. Once at the v=2, J=5 state, another P-branch transition can occur from v=2, J=5 to v=1, J=6. In that case, a photon having a wavelength of 2.83 microns is emitted as indicated by a line 122. Once at the v=1, J=6 state, a third P-branch transition can occur from v=1, J=6 to v=0, J=7 and a wavelength of 2.74 microns is emitted, as indicated by a line 124. Thus, a "cascaded" transition may occur whereby three wavelengths are emitted, 2.93, 2.83 and 2.78 microns.

Figure 6:
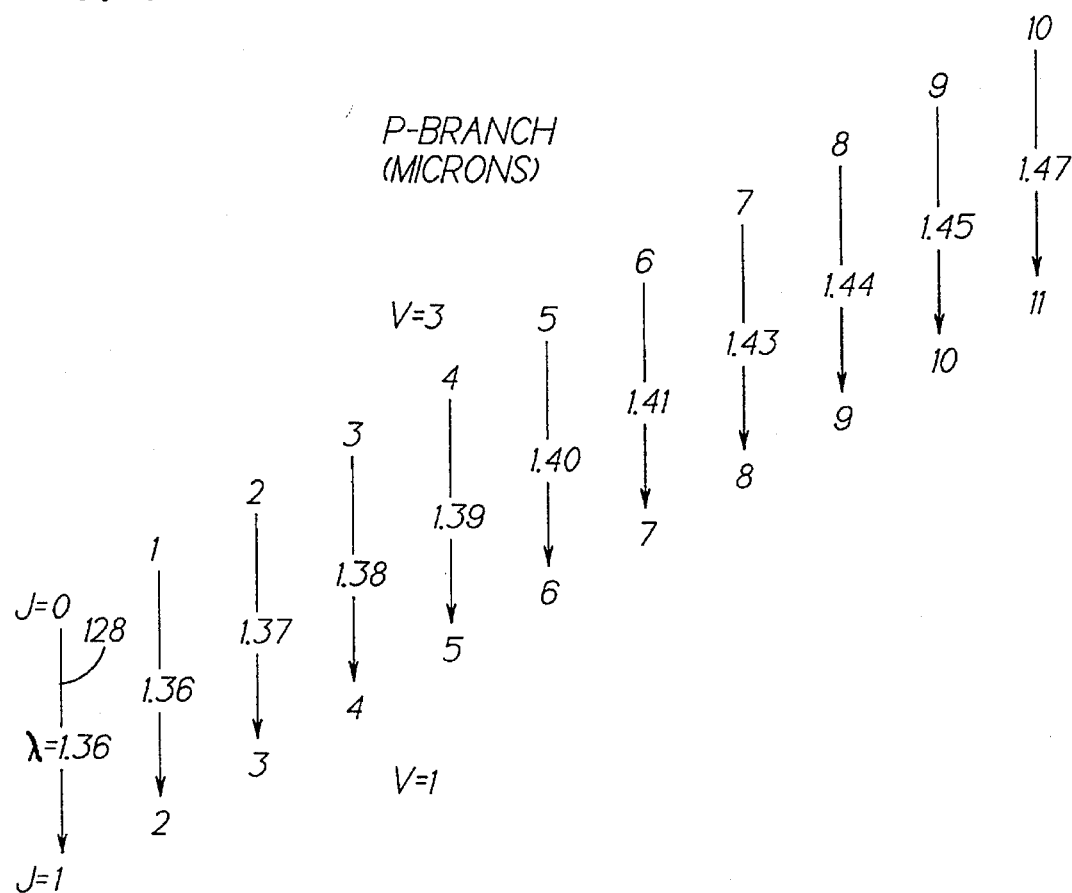
FIG. 6 is a diagram of HF P-branch overtone lasing transitions from v=3 to v=1 level and the associated wavelengths emitted, in accordance with the present invention.

Referring now to FIG. 6, in addition to fundamental lasing transitions and their associated wavelengths, the HF gas also may produce overtone transitions. For example, if the medium is excited to an energy level of v=3, J=4 and an overtone P-branch transition occurs down to v=1, J=5, a lasing wavelength of 1.39 microns is emitted, as indicated by a line 128.

Figure 7:
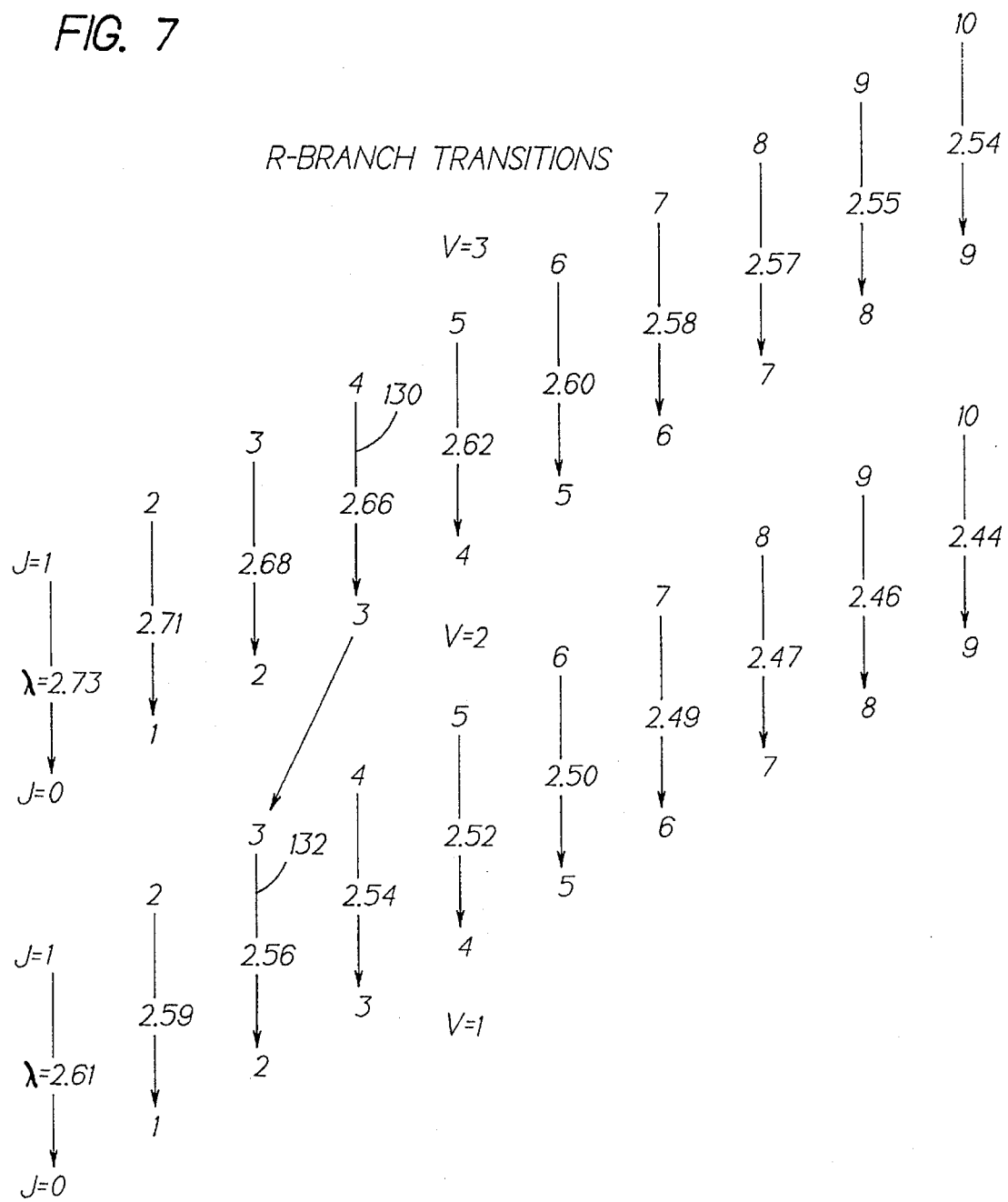
FIG. 7 is a diagram of HF R-branch fundamental lasing transitions from v=3 to v=2 level and from v=2 to v=1 level, and the associated wavelengths emitted, in accordance with the present invention.

Referring now to FIG. 7, for HF R-branch transitions, if the HF medium is excited to a level of v=3, J=4 and an R-branch transition occurs down to v=2, J=3, a wavelength of 2.66 microns is emitted as indicated by a line 130. Once at the v=2, J=3 level, if another R-branch transition occurs from v=2, J=3 to v=1, J=2, a wavelength of 2.56 microns is emitted, as indicated by a line 132. It should be understood that for R-branch transitions the gain is approximately 40% less than for P-branch transitions. Thus, the likelihood of R-branch transitions is significantly less than that of P-branch transitions. However, lasing wavelengths associated with R-branch transitions may be obtained using particular design techniques to optimize those particular wavelengths. Also, as can be seen from FIGS. 5 and 7, a cascading effect can occur and produce two (or more) lasing transitions for a single diode pump line.

Therefore, using HF gas and pumping to a preselected level creates a preselected fundamental lasing transition between about 2.5 and 3.1 microns, or a preselected overtone lasing transition between about 1.36 and 1.47 microns. Consequently, providing laser operation on a single wavelength, or a small number of preselected wavelengths may be achieved. It should be understood that using another gas instead of HF, e.g., any of those shown in FIG. 3, will provide other lasing wavelengths.

Also, it should be understood that the wavelength required to pump to a given level is the same as the wavelength emitted if the molecule transitions from the pumped level to the pre-pumped level, i.e., the same $\Delta E$ produces the same $\lambda$. Here, the wavelengths emitted are different from the pump wavelength because the molecule is being pumped multiple levels above the ground state and then transitioning in a plurality of fundamental or overtone transitions back down to the ground state.

Factors to consider which determine the system efficiency are quantum efficiency $\eta 1$, lasing efficiency $\eta 2$, energy absorption (i.e., absorption coefficient—length product) $\eta 3$, gas relaxation effects $\eta 4$, and laser diode efficiency $\eta 5$.

For the invention described herein, the quantum efficiency is about 80%, the lasing efficiency is 60%, the absorbed diode energy is about 60%, the gas relaxation effects are negligible, and the diode laser efficiency is about 35%. Given these values, a minimum predicted wall-plug efficiency, i.e., input drive current to output optical power, at least 10%, and a light conversion efficiency of at least 29% (photons in to photons out).

The quantum efficiency $\eta 1$, is a measure of how efficiently the gas lases, i.e., the ratio of the energy of the output photon to that of the input photon. If the gas lases all the way down to the ground state v=0, 100% efficiency occurs and no heat is generated. However, if the gas does not lase down to v=0, the remaining energy is eventually released in the form of heat. For the present invention, for lasing on the P-branch fundamental transitions as indicated in FIG. 5, the efficiency approaches 100% for cascading lasing transitions to the v=0 (ground state) levels. In general, the high rotational levels, e.g., v=0, J=7 and up, are not very populated at room temperature; thus, excited molecules can transition down to these levels. Therefore, if the medium can naturally lase down into the upper J levels of the ground state, high efficiency can be achieved. This only occurs for P-transitions because the J-level increases as the molecules transition to the ground state. Also, the molecules will quickly return to the lower J-levels at an equilibrium distribution, thereby allowing re-pumping to occur quickly. For the present invention, the high rotational levels of the ground state are easily reached through the cascading transitions (shown in FIGS. 5 and 9) because the J-level (rotational quantum number) increases by 1 for each fundamental P-branch lasing transition. For overtone lasing transitions such as that shown in FIGS. 6 and 10, the $\eta$ value is about 60%.

The lasing efficiency $\eta 2$, is a measure of the fraction of excited molecules that lase. If all the molecules are pumped to the v=3 level, the gain goes to zero (i.e., lasing stops; or the medium becomes saturated) when the population in the lower lasing level equals the population in the upper level. Thus, if no re-pumping is done or re-pumping is done at a slow rate, 50% of the molecules that are left in the upper vibrational level will eventually be lost to non-lasing transitions (i.e., lost to heat). Also, at a given v-level, there is a given molecular population distribution across the J-levels, i.e., some J-levels have more molecules than other J-levels. This distribution is similar for different V-levels because it only depends on the gas temperature. In addition, for diatomic molecules, such as those used in the present invention, a P-branch lasing transition goes from a given v-level and J-level to a higher J-level at a lower V-level. Because of the difference in the relative population of J-levels across all V-levels, this change in J-level on lasing transitions allows more molecules to lase down to a higher J-level, thereby allowing more that 50%, e.g., 64%, of the molecules in the upper vibrational level to lase. Alternatively stated, it does not take as many molecules in the upper vibrational energy level to produce lasing.

More specifically, for lasing to occur on an overtone transition (i.e., from a given V-level to two V-levels lower (V−2 level)), the following equation must be satisfied:

$$\frac{N_{v,J}}{g_J} - \frac{N_{V-2,J+1}}{g_{J+1}} > 1 \qquad \text{Eq. 1}$$

where, $N_{v,J}$ is the number of molecules/cc in a given v,J energy level and $g_J$ is the degeneracy factor for a given J level (the higher the J-level the more molecules allowed therein).

Also, $N_{v,J}$ equals:

$$N_{v,J} = N_v g_J \exp\left(-\frac{Bhc}{kT_R}(J(J+1))\right) \qquad \text{Eq. 2}$$

where B=rotational constant for HF, h=Plancks constant, k=Boltzmann's constant, $T_R$=rotational temperature, and J=the Jth energy level.

Substituting and rearranging terms gives:

$$\frac{N_V}{N_{V-2}} > \exp\left(\frac{Bhc}{kT_R}(J(J+1)-J(J+1))\right) \qquad \text{Eq. 3}$$

For HF at 300 Kelvin (26 deg. C.), $N_v/N_{v-2}>0.36$ and, therefore, lasing will continue (assuming the threshold gain is exceeded), until the molecular concentration in the upper vibrational level is reduced to 0.36 of that in the ground state. Thus, if the population of the upper vibrational level has zero population prior to pumping, 64% of the diode pumped molecules within the gas can be used for lasing before the medium becomes saturated.

It should be understood that the aforementioned lasing efficiency analysis is only of concern when pumping is done by a pulsed pump at a rate slower than the rate of decay by the non-lasing transitions from the upper state. However, if the time between pumping pulses is faster than the decay time for non-lasing transitions or a continuous wave (cw) pulse is used, the population inversion will be continuously provided and the energy lost due to non-lasing transitions will be minimized.

The energy absorption efficiency factor $\eta 3$ is the fraction of pump energy needed to be absorbed by the HF ground state molecules for lasing to occur. Referring to Table 1, the gas must have a high absorption coefficient $\alpha$ at the laser diode output wavelength. Of the possibilities shown in FIG. 3, HF has the highest absorption coefficient at the currently available laser diode wavelength. For a P-branch pumping transition from v=0 to v=3, Table 1 shows the required pumping wavelength, Einstein's A Coefficient, and the associated absorption coefficient $\alpha$ for HF at a pressure of 10 Torr (0.0132 Atm; 0.193 psi at sea level), for various J-levels. The absorption coefficient $\alpha$, as is known, is a factor that indicates how much light is absorbed by the gas, and is related to the Einstein coefficient A for the gas in a known way. The fraction of absorbed diode laser energy can be calculated from the absorption coefficient $\alpha$ and the propagation pathlength 1 of the pumping radiation by the well known equation: $I_{out}=I_{in} e^{-\alpha L}$; where $I_{out}$ is the radiation that passes through the gas without being absorbed, and $I_{in}$ is the radiation incident on the gas.

Referring to Tables 1 and 2, if the HF gas is at room temperature, i.e., 25 deg C., or slightly below, most HF molecules are at the v=0, J=1 to J=3 state. From Table 1, the average P-branch pumping absorption coefficient α for molecules in this energy range is about 0.01 cm$^{-1}$. Accordingly, for a given propagation pathlength 1 of the pump radiation, the percent absorption of the diode laser power by the HF gas is shown in Table 2 (i.e., the %$I_{out}$ for a given $I_{in}$).

One approach to achieving the required path length 1 is shown in FIG. 1, whereby multiple reflections from sidewalls of the waveguide tube 50 and reflections off the end mirror 48 are used to increase the effective pathlength L. Thus, a tube 50 of about 20 cm in length can provide an effective pathlength 1 long enough to achieve >90% absorption level. Also, the pumping energy must be injected relatively uniformly to provide a substantially homogeneous excited medium. Thus, if only one portion of the gas in the tube 50 is pumped, adequate absorption is not achieved.

Figure 8:
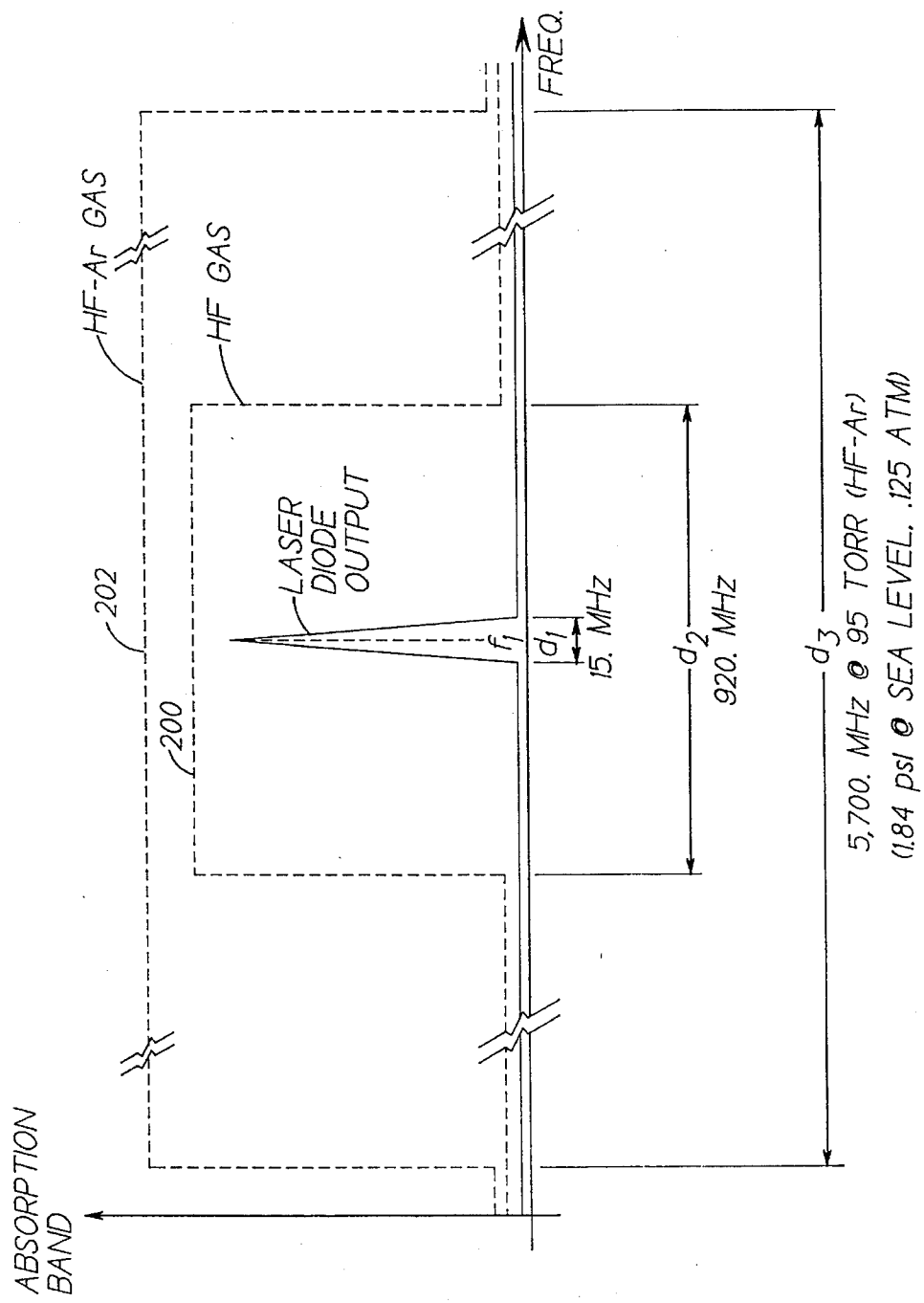
FIG. 8 is a graph showing the absorption frequency bands of the HF gas and HF-Ar gas, and the laser diode output wavelength spread, in accordance with the present invention.

Referring now to FIG. 8, the level of absorption in Table 2 will only be achieved if the diode output frequency $f_1$ is tuned to be within optical absorption band curves 200,202 of the gas. The closer $f_1$ is tuned to the center of the absorption band, the more temperature tolerant the gas absorption will be. The laser diode line-width $d_1$ (i.e., the wavelength spread or bandwidth), of the optical output, is nominally 15 MHz for a Spectra Diode Labs SDL5400. For HF gas, the absorption curve 200 has a "doppler" line-width $d_2$, i.e., the absorption bandwidth at room temperature independent of pressure effects, of 920 MHz.

Also, the absorption bandwidth may be broadened by increasing the pressure of the gas due to collisions of the molecules. For HF, the pressure should not be much higher than 10 Torr; however, we have found that a higher pressure inert gas, such as Argon (Ar), may be added to HF to achieve a pressure broadened line-width. For an Ar partial pressure of 85 Torr and an HF partial pressure of 10 Torr, giving a total pressure of 95 Torr, the pressure broadened curve 202 has an absorption line-width $d_3$ of about 5.7 GHz (HF-Ar). Also, the addition of higher pressure Ar increases the rate of J-level redistribution at the ground state to an equilibrium condition after lasing occurs. It should be understood that the actual absorption band curves 200,202 are not square curves as shown in FIG. 8, but really a normal distribution, or equivalent curve. Any other inert gas may be used if desired, such as Helium (He).

For the laser diode 20 (FIG. 1), the center frequency $f_1$ of the output light, as is known, is tunable to +/–. 24.5 GHz/degree C. for small temperature variations and +/–110 GHz/degree C. for large temperature changes. Thus, the diode laser center frequency $f_1$ can be easily tuned to the center of the absorption band as shown in FIG. 8.

Tuning of the laser diode center frequency $f_1$ is performed by varying the temperature of the laser diode with the thermo-electric (TE) coolers 31 (FIG. 1; discussed more hereinafter), e.g., thermocouples used in the reverse direction. However, other techniques may be used to tune the laser diode center frequency if desired, as discussed hereinafter.

The relaxation loss $\eta_4$ is defined, as is known, as the rate at which vibrational energy is converted into translational energy (which is a measure of heat) and can be calculated from the Pτ value, where P is the pressure in Atmospheres, and τ is the time for the population to decay to 63% of the original excited value (also called the "lifetime" or "time constant" of the molecule). For example, the Pτ value for HF—HF collisions is 0.025 μsec-atm, which means for 1 Atm of excited (v=1) HF, the population at v=1 level reduces to 63% of the original population in 0.025 microseconds. For HF under a pressure of 10 Torr, the lifetime τ is about 1.9 μsec. So for a 2 μsec pump pulse, the maximum allowable HF gas pressure without significant relaxation losses is about 10 Torr.

However, if Ar is added to HF, the Pτ value for HF-Ar collisions is 22 μsec-atm. So, keeping the same lifetime, the total pressure of the HF-Ar may be increased to about 11 Atm (8360 Torr; 161.7 psi at sea level), without affecting the relaxation loss. Therefore, higher pressure (11 Atm) Ar can be added to the HF without increasing the relaxation loss rate. This is desirable, as discussed hereinbefore, to pressure-broaden the absorption frequency band of the HF gas (FIG. 8). Thus, for the present invention, the relaxation losses, for pulsed or cw operation, are negligible.

The laser diode efficiency $\eta_5$ is determined by looking at the electrical efficiency, i.e., current in to photons out. A typical efficiency of an SDL-5400 is about 30%; however laser diodes with more than 60% efficiency has been described in the literature, but are not yet sold commercially. Thus, an assumed laser diode efficiency of 35% is realistic.

Another consideration in laser diode selection is the required laser power needed to achieve the desired lasing gain from the gas. This may be determined from the laser diode "fluence" defined as the output power per cm$^2$. The laser fluence I, needed to pump a given number N of molecules in any gas is given by the equation:

$$I = \frac{N \Delta v_p h v_p}{\Delta v_a \alpha_p} \quad \text{Eq. 4}$$

where $\alpha_p$ is the pump light absorption coefficient; $v_p$ is the pump laser frequency; $\Delta\alpha_p$ and $\Delta v_p$ are the pumped laser and absorption linewidths respectively.

The number of optically pumped gas molecules N must be equal to the number of molecules required to produce the average small-signal gain, g. Thus, assuming no population in the lowest energy level after pumping, N is given by:

$$N = \frac{g}{\sigma} = -\frac{\ln(R_1 R_2)}{2L\sigma} \quad \text{Eq. 5}$$

where R1,R2 are the reflectivities of the two mirrors within the laser cavity, L is the length of the laser cavity; and σ is the gain per molecule or "transition cross-section".

Substituting equations 5 into 4 gives:

$$I = -\frac{\Delta v_p h v_p \ln(R_1 R_2)}{\Delta v_a \alpha_p 2L\sigma} \quad \text{Eq. 6}$$

For fundamental transitions, σ=2.5×10$^{-15}$, and for overtone transitions, σ=4.6×10$^{-15}$ cm$^2$. If L=20 cm, R1=R2= 0.95, and the other quantities as discussed hereinbefore, the minimum fluence required for lasing on a fundamental transition is $I_f$=0.02 μJ/cm$^2$, and the corresponding value for an overtone transition is $I_o$=1.1 μJ/cm$^2$. This number can then be multiplied by the cross-sectional area of the laser tube (πd$^2$; where d=the diameter of the tube), to determine the laser diode ouput power needed to achieve the desired gain. It should be understood that this value for fluence is the minimum that must be absorbed by the gas molecules to produce lasing. Thus, to determine the needed laser diode output power, this number must be increased to account for the less than 100% absorption of the gas, i.e., the absorption coefficient, discussed hereinbefore.

Currently available laser diodes, such as, Aluminum GalliumArsenide (AlGaAs) or IndiumGallium Arsenide (InGaAs) may be used for the present invention. The AlGaAs laser diode operates up to a maximum of about 0.86 microns, and the InGaAs diode operates at about 0.904 microns and up. By operating AlGaAs diodes at high temperature, the lasing wavelengths can be increased to about 0.9 microns; however, the diode lifetime is reduced from 50,000 hours to about 500 hours. A similar trade-off occurs with InGaAs diodes. Other laser diodes may be used if desired, or other semiconductor lasers may be used if desired, provided the required criteria discussed herein are satisfied.

Alternatively, 1.3 micron laser diodes may be used to pump the v=2 level as illustrated by a line 110 in FIG. 3. These laser diodes are sold by Sharp and Mitsubishi. The diodes can also be temperature tuned to the HF gas v=0 to v=2 level absorption band pumping transitions which are stronger (higher absorption coefficient) than the v=0 to v=3 transitions in the 0.87 micron to 0.93 micron band. Although the 1.3 micron absorption band is stronger, however, the 1.3 micron laser diode linewidth (i.e., the wavelength spread), is broader. Thus, the performance is about the same as the aforementioned AlGaAs or InGaAs laser diodes.

For pulsed pumping operation, when the gas is under a low gas pressures, e.g., 10 Torr, the relaxation effects are negligible, and the length of the output pulse will be equal to that of the pump pulse. However, there are two ways to adjust the output pulse length to be shorter than the input pulse length if desired.

First, as the gas lases, the lower level of the lasing transition will gradually fill up. Thus, by adjusting the input pump pulse energy (intensity, i.e., # of photons) so that all the molecules are not pumped until the end of the pulse, lasing can be sustained throughout the diode laser pump pulse. This allows the output pulse time to be the same as the input pulse time. However, if the pump pulse energy were increased such that all the molecules are pumped during the first part of the pulse, the lower level would fill up before the end of the pump pulse. Consequently, lasing would stop before the end of the input pump pulse, thereby causing the output pulse to be shorter than the input pulse.

Second, if the HF gas pressure is increased above 10 Torr, the relaxation losses begin to reduce laser efficiency (as discussed hereinbefore). As a result of the higher pressure, more excited molecules are lost to heat and do not lase. Consequently, the output pulse is shorter than the input pulse, due to this inefficiency. Another effect of higher gas pressure is that more rapid depopulation of the lower rotational lasing levels occurs, thereby allowing a faster pump pulse rate to be used.

For operation on overtone transitions, (i.e., 1.370 to 1.470 microns), the gain is lower than for operation on fundamental transitions (i.e., 2.4 to 3.1 microns). Thus, a wider range of gas pressures can be used for fundamental transitions than for overtone transitions.

Also, the present invention may alternatively be used with continuous wave (cw) pumping. In that case, the energy that is not optically extracted, is removed through heat transfer to the walls of the waveguide tube 50 (FIG. 1). Alternatively, the gas may be circulated to remove waste heat, or the tube may be cooled by known means. Other techniques for removing waste heat may be used if desired.

For adjusting the temperature of the laser diodes 20 (FIG. 1), it is known that diodes fabricated from the center of a semiconductor wafer tend to operate at a single common frequency. Consequently, to economize on the number of TE coolers 28, a group of diodes made from the center of a wafer may be temperature controlled together using a single TE cooler. However, those made from the edges of the wafer, may need to be controlled separately.

In addition to or instead of temperature tuning the laser diodes, the laser diode wavelength and linewidth may also be controlled with an external grating. We have found that a laser diode with an external grating can be discretely tuned over its gain profile while the diode was held at a constant temperature. In that case, the laser diode linewidth is less than 300 Khz.

Figure 9:
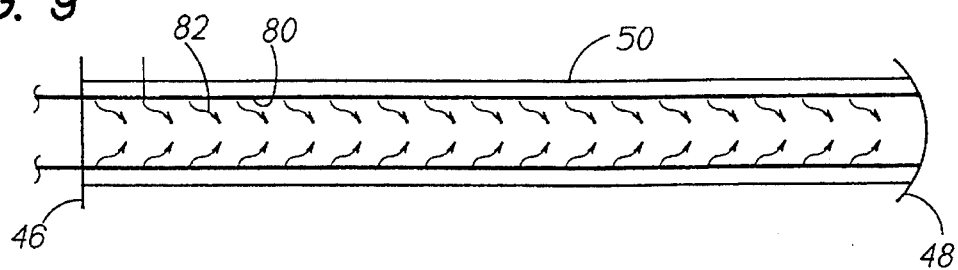
FIG. 9 is a diagram showing optical fibers inside the laser cavity used to excite the gas medium, in an alternative embodiment, in accordance with the present invention.
Figure 10:
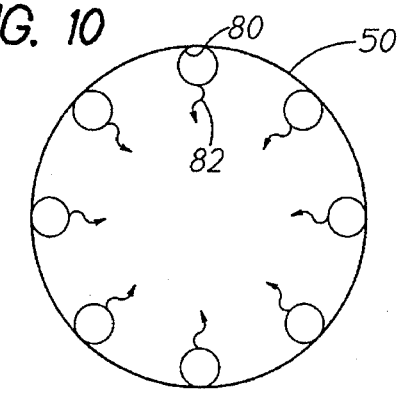
FIG. 10 is a diagram of a cross-section of the lasing tube showing the optical fibers located around the inside radius of the laser tube, in an alternative embodiment, in accordance with the present invention.

Referring to FIGS. 9 and 10, alternative embodiments may be used, such as stringing fibers 80 from the laser diodes 20 (not shown, see FIG. 1) along the inside perimeter of the laser tube 50. In that case, evanescent light field 82 emitted from the side walls of the fibers 80 provide the photons to excite the gas. To optimize the emission of the evanescent field the fibers are selected to have similar, i.e., almost equal, refractive indices for the cladding and the core of the fibers, as is known.

Figure 11:
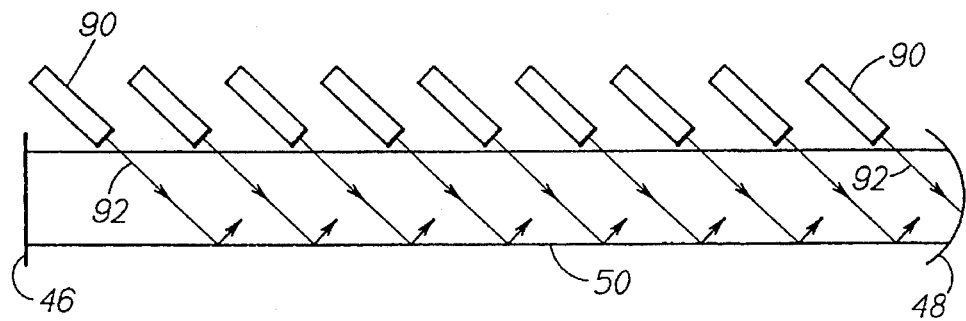
FIG. 11 is a diagram of a plurality of laser diodes injecting pumping radiation into the sides of a laser tube, in an alternative embodiment, in accordance with the present invention.

Referring to FIG. 11, alternatively, if the diameter of the tube 50 is large enough, a plurality of laser diodes 90 may be disposed physically on the perimeter of the laser tube 50 and inject light 92 at an angle to the tube 50 through small holes in the laser tube 50 at different locations along the laser tube 50. Other embodiments may also be utilized to pump the gas using a solid state laser.

In FIG. 1, instead of using the fibers 26 to inject light into the optical elements 34,38, the output light from the diodes may be directly incident on the element 34 without the use of the fibers 26. Also, instead of using lenses 34,38 any optical element capable of collecting beams from a plurality of sources and focussing them as a single beam within the cavity 44 may be used. Further, instead of using laser diodes 20, any semiconductor laser may be used, provided the gas used has adequate absorption in the output wavelength band of the semiconductor laser. Still further, instead of using HF, any Hydrogen Halide gas may be used.

It should be understood by those skilled in the art that the invention may be used to obtain an excited molecular gas medium that may be used for many different applications, e.g., an amplifier, a resonator (laser), or any device that requires an excited medium to operate. Furthermore, any device that needs a small number of lasing wavelengths, or selective control of the output lasing wavelengths may employ the invention to achieve this objective.

Also, it should be understood that the invention will work equally well with any molecular gas provided the pumping semiconductor laser has an output wavelength spread near the absorption frequency band of the gas and has a wavelength capable of pumping the gas molecules from the ground state to an excited state. Also, as discussed hereinbefore, the pumping energy should be injected relatively uniformly to provide a substantially homogeneous excited medium and the pathlength of pumping energy should be sufficient to allow absorption.

It should be understood that the laser diodes 20 (FIG. 1) need not be phase locked (coherently coupled) to each other; however they must be operating at the same frequency. Consequently, the invention provides a gas laser that can be easily scaled to any power level by adding the desired number of pumping laser diodes.

Although the invention has been described and illustrated with respect to the exemplary embodiments thereof, it should be understood by those skilled in the art that the foregoing and various other changes, omissions and additions may be made without departing from the spirit and scope of the invention.

TABLE 1

HF $\Delta V = 3$ Absorption Coefficients (10 Torr)

| P-Branch Pumping Transition from $V = 0$ to $V = 3$ | Pumping Water length $\lambda$ (Microns) | Einstein's Coefficient A (sec$^{-1}$) | Absorption Coefficient (cm$^{-1}$) $\alpha$ |
|---|---|---|---|
| $V = 0, J = 1$ to $V = 3, J = 0$ | 0.882 | 1.23 | 0.0096 |
| $V = 0, J = 2$ to $V = 3, J = 1$ | 0.886 | 0.80 | 0.01275 |
| $V = 0, J = 3$ to $V = 3, J = 2$ | 0.890 | 0.745 | 0.0111 |
| $V = 0, J = 4$ to $V = 3, J = 3$ | 0.894 | 0.713 | 0.00542 |
| $V = 0, J = 5$ to $V = 3, J = 4$ | 0.899 | 0.695 | 0.00328 |
| $V = 0, J = 6$ to $V = 3, J = 5$ | 0.904 | 0.683 | 0.00123 |
| $V = 0, J = 7$ to $V = 3, J = 6$ | 0.910 | 0.675 | 0.000373 |

TABLE 2

| % Absorption | Pathlength, l, (cm) |
|---|---|
| 10% | 10.5cm |
| 50% | 69.3 |
| 90% | 230. |
| 99% | 460. |

I claim:

1. A semiconductor laser pumped molecular gas laser, comprising:
   a plurality of semiconductor lasers each emitting pumping light having a pumping wavelength;
   a molecular gas having an absorption frequency band;
   said pumping wavelength of said semiconductor lasers being within said absorption frequency band of said gas and being capable of pumping said gas molecules from the ground state to an excited state;
   gas laser cavity means, disposed in the path of said pumping light from said plurality of semiconductor lasers, for housing said molecular gas, for allowing said pumping wavelength into said cavity, and for providing an output laser light having a lasing wavelength; and
   said pumping light being injected relatively uniformly into said gas lasing cavity means to provide a substantially homogeneous excited medium and the pathlength of said pumping light being sufficient to allow absorption of said pumping light by said gas.

2. The gas laser of claim 1 wherein said gas laser cavity means comprises:
   a waveguide tube for housing said molecular gas to be pumped by said pumping light, being reflective at said pumping wavelength and said lasing wavelength;
   a first mirror disposed at a first end of said tube, being transmissive at said pumping wavelength and being reflective at said lasing wavelengths; and
   a second mirror disposed at a second end of said tube, opposite said first end, being reflective at said pumping wavelength and being transmissive at said lasing wavelengths.

3. The gas laser of claim 2 wherein said waveguide tube comprises a glass tube coated with a highly reflective coating.

4. The gas laser of claim 3 wherein said waveguide tube acts as a heat sink.

5. The gas laser of claim 1 further comprising an optical fiber associated with each of said plurality of semiconductor lasers for propagating said pumping light from said semiconductor lasers to said gas laser cavity means.

6. The gas laser of claim 5 wherein said optical fiber associated with each of said plurality of semiconductor lasers emits an evanescent field from the sides of said fiber to excite said gas.

7. The gas laser of claim 1 further comprising optical means for converting divergent light emitted from said semiconductor lasers to focussed light incident on said gas within said gas laser cavity means.

8. The gas laser of claim 1 further comprising frequency control means for controlling said pumping wavelength of said pumping light to near the center of said absorption band.

9. The gas laser of claim 8 wherein said frequency control means comprises thermoelectric coolers disposed on said semiconductor lasers.

10. The gas laser of claim 1 wherein said molecular gas is a hydrogen halide gas.

11. The gas laser of claim 1 wherein said molecular gas is a gas selected from the group consisting of HF, DF, HCl, HBr, and CO.

12. The gas laser of claim 11 wherein said inert gas comprises Argon.

13. The gas laser of claim 1 further comprising an inert gas having a higher partial pressure than said molecular gas, to pressure-broaden said absorption frequency band.

14. The gas laser of claim 1 wherein said pumping light is continuous wave.

15. The gas laser of claim 1 wherein said pumping light is pulsed at a predetermined pulse length.

16. The gas laser of claim 15 wherein the pulse length of said output laser light is shorter than said pulse length of said pumping light.

17. An apparatus for providing an excited molecular gas medium, comprising:
   a plurality of semiconductor lasers each emitting pumping light having a pumping wavelength;
   a molecular gas having an absorption frequency band;
   said pumping wavelength of said semiconductor lasers being within said absorption frequency band of said gas and being capable of pumping said gas molecules from the ground state to an excited state;
   gas containment means, disposed in the path of said pumping light from said plurality of semiconductor lasers, for housing said molecular gas and for allowing said pumping wavelength into said cavity; and
   said pumping light being injected relatively uniformly into said gas lasing cavity means to provide a substantially homogeneous excited medium and the pathlength of said pumping light being sufficient to allow absorption of said pumping light by said gas.

18. The apparatus of claim 17 further comprising an optical fiber associated with each of said plurality of semiconductor lasers for propagating said pumping light from said semiconductor lasers to said gas containment means.

19. The apparatus of claim 17 further comprising optical means for converting divergent light emitted from said semiconductor lasers to focussed light incident on said gas within said gas laser cavity means.

20. The apparatus of claim 17 further comprising wavelength control means for controlling said pumping wavelength of said pumping light to near the center of said absorption band.

21. The apparatus of claim 17 wherein said wavelength control means comprises thermoelectric coolers disposed on said semiconductor lasers.

22. The apparatus of claim 17 wherein said molecular gas is a hydrogen halide gas.

23. The apparatus of claim 17 wherein said plurality of semiconductor lasers comprise laser diodes.

24. The apparatus of claim 17 wherein said molecular gas is a gas selected from the group consisting of HF, DF, HCl, HBr, and CO.

25. The gas laser of claim 17 further comprising an inert gas having a higher partial pressure than said molecular gas, to pressure-broaden said absorption frequency band.

26. The gas laser of claim 17 wherein said inert gas comprises Argon.

* * * * *